United States Patent [19]

Jiang et al.

[11] Patent Number: 5,706,306

[45] Date of Patent: Jan. 6, 1998

[54] VCSEL WITH DISTRIBUTED BRAGG REFLECTORS FOR VISIBLE LIGHT

[75] Inventors: Wenbin Jiang, Phoenix; Jamal Ramdani, Gilbert; Michael S. Lebby, Apache Junction, all of Ariz.

[73] Assignee: Motorola, Schaumburg, Ill.

[21] Appl. No.: 616,359

[22] Filed: Mar. 15, 1996

[51] Int. Cl.$^6$ ............................................. H01S 3/19
[52] U.S. Cl. ................................... 372/96; 372/45
[58] Field of Search ......................... 372/96, 44, 45

[56] References Cited

U.S. PATENT DOCUMENTS 5,568,499 10/1996 Lear .................................... 372/45

*Primary Examiner*—James W. Davie
*Attorney, Agent, or Firm*—Eugene A. Parsons

[57] ABSTRACT

An article and method for making a vertical cavity surface emitting laser (101) is provided. The vertical cavity surface emitting laser includes a semiconductor substrate (102) having a first surface (105) on which a first set of distributed Bragg reflectors (103) are deposited. The distributed Bragg reflectors (103) are made of alternating layers of indium aluminum gallium phosphide and aluminum arsenide. An active region (106) is disposed on the distributed Bragg reflectors with a subsequent of and active region (106) and another cladding region (107). Another distributed Bragg reflector (103) is deposited on cladding region (107).

15 Claims, 1 Drawing Sheet

VCSEL WITH DISTRIBUTED BRAGG REFLECTORS FOR VISIBLE LIGHT

FIELD OF THE INVENTION

This invention relates, in general, to layered optical devices and, in particular, to laser optical devices.

BACKGROUND OF THE INVENTION

At present, conventional edge emitting semiconductor lasers are playing a more significant role in optical communication due to there high operating efficiency and modulation capabilities; however, the conventional edge emitting semiconductor laser has several short comings or problems, thus making this edge emitting device difficult to use in several applications.

Recently, however, there has been an increased interest in vertical cavity surface emitting lasers (VCSEL)s. The conventional VCSEL has several advantages, such as planar construction, emitting light perpendicular to the surface of the die, and the possibility of fabrication in an array. However, while conventional VCSELs have several advantages, conventional VCSELs have several disadvantages with regard to the visible spectrum, such as poor efficiency, poor reflectivity of the distributed Bragg reflectors, and the like. Additionally, because of these problems, manufacturability of VCSELs for the visible spectrum is severely limited.

A conventional approach taken to solve the reflectivity problem is to increase the number of reflective elements or alternating layers that comprise the conventional distributed Bragg reflectors. However, this approach does not resolve the reflectivity problem in conventional VCSELs, but exacerbates several other problems, such as defect density, and the like, thereby limiting manufacturability.

For example, as a result of the poor reflectivity of the conventional distributed Bragg reflectors, many additional alternating layers (e.g., as many as 50 to 200 additional alternating layers) are deposited, in an attempt to increase the reflectivity of the conventional distributed Bragg reflectors. However, by increasing the number of alternating layers, an increase in the cost of manufacture is realized. More particularly, with the increased number of alternating layers, an increase in defect density of the alternating layers is produced, as well as an increase in the amount of time required to manufacture the layers, thereby producing a substantial increase in the cost of manufacturing conventional VCSELs, as well as a decrease in the quality of VCSEL manufactured, thus making conventional VCSELs not suitable for high volume manufacturing for this purpose.

It can readily be seen that conventional edge emitting semiconductor lasers and conventional vertical cavity surface emitting lasers have several disadvantages and problems, thus not enabling their use in high volume manufacturing applications. Therefore, a VCSEL and method for making that simplifies the fabrication process, reduces cost, with an improved reliability of the VCSEL would be highly desirable.

DETAILED DESCRIPTION OF THE DRAWINGS

Figure 1:
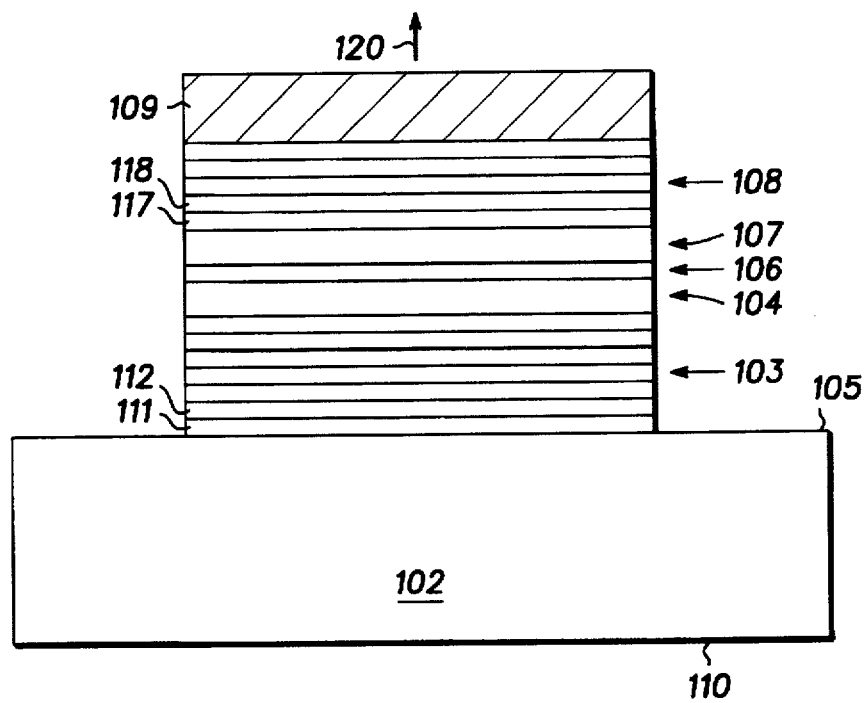
FIG. 1 is an example of an enlarged simplified cross-section of a VCSEL device prepared on a substrate.

FIG. 1 illustrates an enlarged vertical cavity surface emitting laser (VCSEL) 101 formed on a substrate 102 having surfaces 105 and 110 with light 120 being emitted from VCSEL 101. It should be understood that while FIG. 1 only illustrates a single VCSEL 101, VCSEL 101 may represent many VCSELs that are located on substrate 102 to form arrays. Generally, VCSEL 101 is made of several defined areas or regions, such as a distributed Bragg reflector 103 having a plurality of alternating layers illustrated by layers 111 and 112, a cladding region 104, an active region 106, a cladding region 107, a distributed Bragg reflector 108 having a plurality of alternating layers illustrated by layers 117 and 118, and a contact region 109.

Substrate 102, in this example, is made of any suitable material, such as gallium arsenide, silicon, or the like. Typically, substrate 102 is made of gallium arsenide so as to facilitate epitaxial growth of subsequent multiple layers that comprise VCSEL 101.

Typically, any suitable epitaxial deposition method, such as molecular beam epitaxy (MBE), metal organic chemical vapor deposition (MOCVD), or the like is used to make the required multiple layers for VCSEL 101. These methods allow for the epitaxial deposition of material layers, such as indium aluminum gallium phosphide, aluminum arsenide, gallium arsenide, aluminum gallium arsenide, aluminum gallium phosphide, indium aluminum phosphide, and the like. It should be understood that epitaxial deposition is used extensively to produce the multitude of layers that comprise VCSEL 101.

Referring now to distributed Bragg reflectors 103 and 108, it should be understood that distributed Bragg reflector 103 is deposited first with subsequent deposition defining cladding region 104, active region 106, cladding region 107, distributed Bragg reflector 108, and contact region 109. Generally, thicknesses of alternating layers 111, 112, 117 and 118 are typically set as portions of a wavelength of light 120 that VCSEL 101 is designed to emit. Thus, specific thicknesses of the alternating layers 111, 112, 117, and 118 are a function of the designed wavelength that the VCSEL 101 is to operate at. Typically, the most common wavelength values used are one quarter, one half, three quarters, full wavelength, or any multiples thereof. In a preferred embodiment of the present invention, one quarter wavelength thicknesses are used.

Generally, doping of the distributed Bragg reflectors 103 and 108 is split with one of the distributed Bragg reflectors being N-type and the other being P-type. Since doping levels are well known in the art, the doping levels will not be describe herein other than to identify material either as undoped, P-typed doped such as with carbon, zinc or the like, or N-typed doped such as with beryllium, silicon, or the like. Briefly, distributed Bragg reflector 103 and a portion of cladding region 104 are N-typed doped, with a portion of cladding region 104, active region 106, a portion of cladding region 107 being undoped, and with a portion of cladding region 107, distributed Bragg reflector 108, and contact region 109 being P-typed doped.

In the present invention, distributed Bragg reflectors 103 and 108 having alternating layers 111 and 112, 117 and 118 are made of any suitable materials, such as indium aluminum gallium phosphide and aluminum arsenide (e.g., $In_{0.49}Al_xGa_{0.51-x}P/AlAs$), indium aluminum gallium phosphide and indium aluminum phosphide (e.g., $In_{0.49}Al_xGa_{0.51-x}P/In_{0.49}Al_{0.5}P$), and aluminum gallium arsenide and aluminum arsenide (e.g., $Al_{0.5}Ga_{0.5}As/AlAs$), which are epitaxially disposed or deposited on or overlaying substrate 102, thereby generating distributed Bragg reflectors 103 and 108 having substantially higher reflectivity in the visible spectrum than conventional distributed Bragg reflectors. Additionally, it should be understood that in each of the above examples where a percent composition of a particular element is given it should be considered only as an example. It should be further understood that variations from these examples can be large and are to be considered part of the present invention.

For example, selecting indium aluminum gallium phosphide and aluminum arsenide ($In_{0.49}Al_xGa_{0.51-x}P/AlAs$) as a material structure for distributed Bragg reflectors 103 and 108, allows for reflection of visible light generated by active region 106. Suitable reflectivity from the indium aluminum gallium phosphide can be achieved by having a percent composition of indium range from 48 percent to 50 percent. By varying the percent composition of indium, a corresponding variation in a percent composition of gallium occurs with a nominal range from 52 percent to 50 percent. Additionally, aluminum percent concentration can range from 0 percent to 51 percent, with preferred range from 5 percent to 15 percent, and a nominal range from 7 percent to 13 percent. It should be pointed out that the percent composition of the aluminum reduces that percent concentration of gallium, thereby producing a balanced composition.

In another example, selecting indium aluminum gallium phosphide and indium aluminum phosphide ($In_{0.49}Al_xGa_{0.51-x}P/In_{0.49}Al_{0.51}P$) as a material structure for distributed Bragg reflectors 103 and 108, also allows for reflection of visible light generated from active area 106. As previously described, the indium aluminum gallium phosphide in the present example can be varied similarly. In addition, the indium aluminum phosphide can also be varied, with the percent composition of indium ranging from 48 percent to 50 percent. Also, the aluminum percent composition can range from 1 percent to 10 percent, with a preferred range from 8 percent to 2 percent, and with a nominal range from 4 percent to 6 percent.

In yet another example, selecting aluminum gallium arsenide and aluminum arsenide ($Al_{0.5}Ga_{0.5}As/AlAs$) as a material structure for distributed Bragg reflectors 103 and 108, also allows for reflection of visible light generated from active area 106. However, in this example, the aluminum and the gallium of the aluminum gallium arsenide can be varied. Generally, the aluminum of the aluminum gallium arsenide can range from range from 0 percent to 100 percent, with a nominal range from 40 percent to 60 percent, and the gallium can range from 0 percent to 100 percent, with a nominal range from 40 percent to 60 percent.

By selecting any of the above examples as the material set for alternating layers 111, 117 and 112, 118, respectively, allows a reduction or a decrease in the number of alternating layers in distributed Bragg reflectors 103 and 108. Generally, by using any of the above examples as the material structures, alternating layers 111 and 112 in distributed Bragg reflector 103 can be minimized to 40 pair, while alternating layers 117 and 118 in distributed Bragg reflector 108 can be minimized to 28 pair, thereby simplifying the process for manufacturing distributed Bragg reflectors 103 and 108, as well as improving performance of the reflectivity of distributed Bragg reflectors 103 and 108. It is believed that by using these chemical compositions an increased difference is generated between the refractive indexes of the alternating layers 111, 112 and 117 and 118, i.e., there is a larger difference of refractive index between layers 111 and 112, and likewise between layers 117 and 118, thereby increasing reflectivity. It is further believed that this increase in reflectivity enables the decrease in the number of alternating layers 111, 112, 117, and 118 in distributed Bragg reflectors 103 and 108. Thus, an improvement in performance results.

Also, as a result of the decrease in the number of alternating layers, fabrication of VCSEL 101 is greatly simplified, thereby making VCSELs more manufacturable and less costly. Since the manufacture or fabrication is simplified and since a fewer number of steps are required, overall defect density is also reduced with a corresponding increase in manufacturability and a further lowering of cost is obtained.

For the sake of simplicity and to prevent overcrowding of the figure, cladding region 104 is shown as a single layer; however, it should be understood that cladding region 104 is made of at least two components that are epitaxially disposed or deposited on distributed Bragg reflector 103. First, a layer of any suitable material such as indium aluminum gallium phosphide having an appropriate thickness and being doped similarly to distributed Bragg reflector 103 is epitaxially deposited on distributed Bragg reflector 103.

By way of example, an n-doped indium aluminum gallium phosphide layer ($In_{0.49}Al_xGa_{0.51-x}P$) is epitaxially deposited on distributed Bragg reflector 103. Generally, the indium aluminum gallium phosphide layer has a thickness that is determined by the wavelength of light that is to be emitted from the VCSEL 101, thereby allowing the thickness of the indium aluminum gallium phosphide layer to be any suitable thickness. Second, a layer of any suitable material such as undoped indium aluminum gallium phosphide having an appropriate thickness is epitaxially deposited on the first layer of the cladding region 104.

For the sake of simplicity, active region 106 is represented by a single layer which is epitaxially deposited or disposed on cladding region 104; however, it should be understood that the active region 106 can include multiple layers of barrier regions with quantum well regions interspersed. By way of a simple example, active region 106 is made of at least two barrier layers and a quantum well region with the quantum well region being position between the two barrier regions. The quantum well is made of undoped indium gallium phosphide (InGaP) and the barrier regions are made of indium aluminum gallium phosphide (InAlGaP). Typically, active region 106 includes three to five quantum wells with their corresponding barrier regions.

For the sake of simplicity and to prevent overcrowding of the figure, cladding region 107 is shown as a single layer; however, it should be understood that cladding region 107 is made of two components that are disposed or deposited epitaxially on active region 106. First, a layer of any suitable undoped cladding material is epitaxially deposited to an appropriate thickness on active region 106. Second, a layer of any suitable doped cladding material is epitaxially deposed on the undoped cladding material.

By way of example, an undoped indium aluminum gallium phosphide ($In_{0.49}Al_xGa_{0.51-x}P$) layer is epitaxially deposited on active region 106. Generally, the undoped indium aluminum gallium phosphide has a thickness that is determined by the wavelength of light that is to be emitted from the VCSEL 101, thereby allowing the thickness of the aluminum gallium arsenide layer to be any suitable thickness. Subsequently, a doped indium aluminum gallium phosphide ($In_{0.49}Al_xGa_{0.51-x}P$) layer is epitaxially deposited on the undoped layer. The doped layer is generally doped with a p-type dopant.

Contact region 109 is formed by disposing any suitable conductive material on distributed Bragg reflector 108, such as indium tin oxide, gold, platinum, or the like. It should be understood that depending upon which material selection is made the specific method of disposing and patterning of that specific material will change to form contact region 109.

Figure 2:
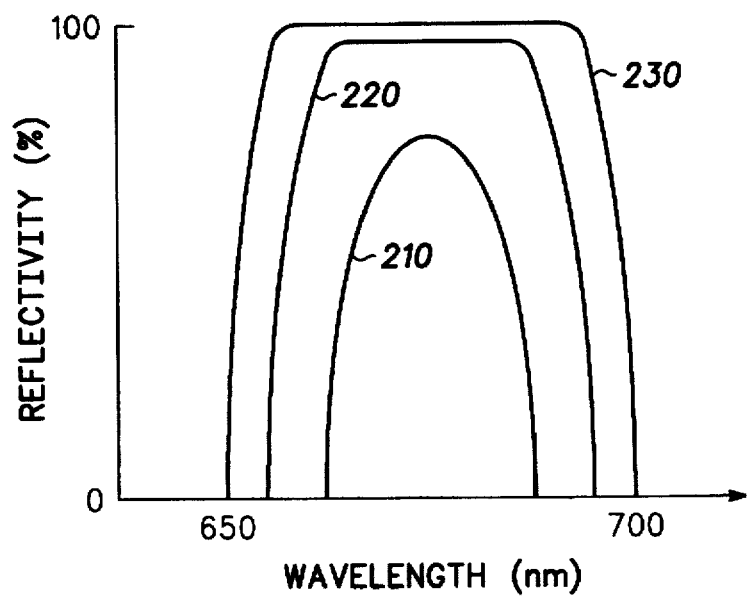
FIG. 2 is a simplified graphical illustration of reflectivity versus wavelength.

FIG. 2 is a simplified graphical representation of reflectivity versus wavelength curves of several examples of different material composition for VCSEL 101. Each line 210, 220, and 230 represents a different material composition of alternating layers 111, 112 and 117, 118 of distributed Bragg reflectors 103 and 108 as shown in FIG. 1.

Regarding line 210, having material composition $In_{0.49}Al_{0.1}Ga_{0.41}P/In_{0.49}Al^{0.5}P$, it can be seen that bandwidth, i.e., the width of responsive frequencies, is much narrower then either line 220 or line 230, as well as having lower reflectivity.

Regarding line 220 having material composition $Al_{0.5}Ga_{0.5}As/AlAs$ it can be seen that the bandwidth has improved; however, the band width of line 220 is not as good as demonstrated in line 230.

Regarding line 230 having material composition $In_{0.49}Al_{0.1}Ga_{0.41}P/AlAs$ it can be seen that the bandwidth is better than either line 210 or 220, thus making the material composition of line 230 preferred.

However, it should be understood that any of lines 210, 220, and 230 are usable for reflecting light in the visible spectrum. It should be further understood that while three specific examples have been provided other material compositions are possible.

While we have shown and described specific embodiments of the present invention, further modification and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A VCSEL with distributed Bragg reflectors for visible light comprising:

a semiconductive substrate having a first surface and a second surface;

a first distributed Bragg reflector disposed on the first surface of the semiconductor substrate, the first distributed Bragg reflector including alternating layers of indium aluminum gallium phosphide and aluminum arsenide with a percent composition of indium in the indium aluminum gallium phosphide ranging from 44 percent to 54 percent and a percent composition of gallium in the indium aluminum gallium phosphide ranging from 41 percent to 61 percent, and with the first distributed Bragg reflector having a first dopant type and a first concentration;

a first cladding region disposed on the first distributed Bragg reflector;

an active region disposed on the cladding region;

a second cladding region disposed on the active region;

a second distributed Bragg reflector disposed on the second cladding region, the second distributed Bragg reflector including alternating layers of indium aluminum gallium phosphide and aluminum arsenide with a percent composition of indium in the indium aluminum gallium phosphide ranging from 44 percent to 54 percent and a percent composition of gallium in the indium aluminum gallium phosphide ranging from 41 percent to 61 percent, and with the second distributed Bragg reflector having a second dopant type and a second dopant concentration; and a contact region disposed on the second distributed Bragg reflector, whereby light generated in the active region emanates from the VCSEL as visible light.

2. A VCSEL with distributed Bragg reflectors for visible light as claimed in claim 1 wherein the first dopant type is an N-type.

3. A VCSEL with distributed Bragg reflectors for visible light as claimed in claim 2 wherein the N-type dopant is selenium or silicon.

4. A VCSEL with distributed Bragg reflectors for visible light as claimed in claim 2 wherein the N-type dopant is silicon.

5. A VCSEL with distributed Bragg reflectors for visible light as claimed in claim 1 wherein the second dopant type is a P-type.

6. A VCSEL with distributed Bragg reflectors for visible light as claimed in claim 5 wherein the P-type dopant is carbon.

7. A VCSEL with distributed Bragg reflectors for visible light as claimed in claim 5 wherein the P-type dopant is zinc.

8. A VCSEL with distributed Bragg reflectors for visible light as claimed in claim 1 wherein the percent composition of indium in the indium aluminum gallium phosphide ranges from 44 percent to 54 percent and wherein the percent composition of gallium in the indium aluminum gallium phosphide ranges from 46 percent to 56 percent.

9. A VCSEL with distributed Bragg reflectors for visible light as claimed in claim 8 wherein the percent composition of indium in the indium aluminum gallium phosphide ranges from 46 percent to 54 percent and wherein a percent composition of gallium in the indium aluminum gallium phosphide ranges from 46 percent to 54 percent.

10. A VCSEL with distributed Bragg reflectors for visible light as claimed in claim 1 wherein a percent composition of aluminum in the indium aluminum gallium phosphide ranges from greater than zero percent to 54 percent.

11. A VCSEL with distributed Bragg reflectors for visible light as claimed in claim 10 wherein the percent composition of aluminum in the indium aluminum gallium phosphide ranges from 5 percent to 15 percent.

12. A VCSEL with distributed Bragg reflectors for visible light as claimed in claim 11 wherein the percent composition of aluminum in the indium aluminum gallium phosphide ranges from 8 percent to 12 percent.

13. A VCSEL with distributed Bragg reflectors for visible light as claimed in claim 1 wherein the first cladding region further comprises:

a doped layer of indium aluminum gallium phosphide disposed on the first distributed Bragg reflector; and a undoped layer of indium aluminum gallium phosphide overlying the doped layer of indium aluminum gallium phosphide.

14. A VCSEL with distributed Bragg reflectors for visible light as claimed in claim 13 wherein the active region further comprises:

a first barrier layer of indium aluminum gallium phosphide disposed on the undoped layer of indium aluminum gallium phosphide disposed on the first distributed Bragg reflector;

a quantum well layer of indium aluminum gallium phosphide overlying the first barrier of undoped layer of aluminum gallium phosphide; and a second barrier layer of indium aluminum gallium phosphide disposed on the quantum well layer of indium aluminum gallium phosphide.

15. A VCSEL with distributed Bragg reflectors for visible light comprising:

a semiconductive substrate having a first surface and a second surface;

a first distributed Bragg reflector disposed on the first surface of the semiconductive substrate, the first distributed Bragg reflector comprising alternating layers of indium aluminum gallium phosphide and indium aluminum phosphide with the first distributed Bragg reflector having a first dopant type and concentration;

a first cladding region disposed on the first distributed Bragg reflectors;

an active region disposed on the cladding region;

a second cladding region disposed on the active region;

a second distributed Bragg reflector disposed on the second cladding region, the second distributed Bragg reflector comprising alternating layers of indium aluminum gallium phosphide and indium aluminum phosphide with the second distributed Bragg reflector having a second dopant type and a second dopant concentration; and a contact region disposed on the second distributed Bragg reflector, whereby light generated in the active region emanates from the VCSEL as visible light.

* * * * *